United States Patent
Oba

(10) Patent No.: US 7,864,093 B2
(45) Date of Patent: Jan. 4, 2011

(54) PULSE PHASE DIFFERENCE DETECTING CIRCUIT AND A/D CONVERTER USING THE SAME

(75) Inventor: Hiroyuki Oba, Kanagawa (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/461,471

(22) Filed: Aug. 12, 2009

(65) Prior Publication Data

US 2010/0045503 A1 Feb. 25, 2010

(30) Foreign Application Priority Data

Aug. 19, 2008 (JP) ............................. 2008-210646

(51) Int. Cl.
 *H03M 1/60* (2006.01)
(52) U.S. Cl. .................... 341/157; 341/155; 327/161
(58) Field of Classification Search ................. 341/157
 See application file for complete search history.

(56) References Cited

U.S. PATENT DOCUMENTS 6,466,151 B2 * 10/2002 Nishii et al. ............... 341/155
6,879,278 B2 * 4/2005 Watanabe et al. .......... 341/155
7,292,175 B2 * 11/2007 Watanabe ................... 341/157
7,755,530 B2 * 7/2010 Terazawa et al. ........... 341/157

FOREIGN PATENT DOCUMENTS

| JP | 3-125514 | 5/1991 |
|---|---|---|
| JP | 2004-357030 | 12/2004 |

* cited by examiner

*Primary Examiner*—Khai M Nguyen
(74) *Attorney, Agent, or Firm*—McGinn IP Law Group, PLLC

(57) ABSTRACT

Provided is a pulse phase difference detecting circuit including: a first delay circuit that receives a first pulse signal to output a signal obtained by delaying the first pulse signal as a second pulse signal and includes multiple serially-connected delay units having the same delay amount; a second delay circuit that receives the second pulse signal and includes multiple serially-connected delay units having the delay amount; a first delay adjustment circuit that adjusts a delay amount with respect to the second pulse signal and outputs the adjusted second pulse signal back to the first delay circuit as a third pulse signal; and a pulse arrival position detecting circuit that detects a pulse arrival position of the first pulse signal based on outputs of the delay units of the first and second delay circuits that are transmitted as the third and second pulse signals, respectively.

13 Claims, 10 Drawing Sheets

PULSE PHASE DIFFERENCE DETECTING CIRCUIT AND A/D CONVERTER USING THE SAME

BACKGROUND

1. Field of the Invention

The present invention relates to a pulse phase difference detecting circuit and an A/D converter using the same.

2. Description of Related Art

In general, examples of A/D converters (ADCs: analog-to-digital converters) for converting analog signals into digital signals at high speed include a flash type A/D converter and a successive approximation type A/D converter. The flash type and successive approximation type A/D converters, however, require a large number of reference voltages and comparators corresponding to a given resolution, which results in an increase in circuit size and cost of a device. In order to improve the accuracy of each of the reference voltages and comparators, semiconductor processes and devices with excellent analog characteristics are required. Additionally, in order to prevent a fluctuation in electrical characteristics of ADCs due to a layout pattern, it is necessary to select a layout pattern from a library of hard macros, resulting in limitation in the degree of freedom of design such as layout placement.

In this regard, there is known an ADC achieving a reduction in cost and circuit size by utilizing the fact that a delay amount of a delay element has a voltage dependence (see Japanese Unexamined Patent Application Publication Nos. 03-125514 and 2004-357030). The ADC generates a pulse phase difference according to an input voltage serving as an analog signal, and detects the phase difference by using a digital circuit.

FIG. 9 shows a pulse phase difference detecting circuit disclosed in FIG. 1 of Japanese Unexamined Patent Application Publication No. 03-125514. The pulse phase difference detecting circuit includes a gate delay circuit 10 and a synchronizing pulse detecting circuit 20. In the gate delay circuit 10, an input pulse signal PA is input to an inverter 41, and the output of the inverter 41 is connected to the input of an inverter 42 and is output as an output pulse signal P1. Further, the outputs and the inputs of inverters 43 to 4L are connected in a similar manner, and the outputs of even-numbered inverters 44 to 4L are output as output pulse signals P2 to Pn, respectively. In other words, the output pulse signals P1 to Pn are generated using delay times caused by the inverters 41 to 4L.

The synchronizing pulse detecting circuit 20 includes D flip-flops (D-FFs: Delay flip-flops) 51 to 5n which receive the output pulse signals P1 to Pn, respectively, as data from the gate delay circuit 10, and which also receive a pulse signal PB as a clock. Further, the synchronizing pulse detecting circuit 20 includes an AND gate 61 which receives an output Q of the D-FF 51 and an inverted output −Q of the D-FF 52, and which outputs a synchronizing pulse signal P01. Furthermore, the synchronizing pulse detecting circuit 20 includes AND gates 62 to 6m that receive outputs Q and inverted outputs −Q of the D-FFs 52 to 5n, and output synchronizing pulse signals P02 to P0m, respectively, in a similar manner.

It is generally known that, when the power supply voltage of an inverter is varied, the amount of delay caused by the inverter varies. Specifically, an increase in the power supply voltage causes a reduction in the delay amount, and a reduction in the power supply voltage causes an increase in the delay amount. In the technology disclosed in Japanese Unexamined Patent Application Publication No. 03-125514, a reduction in the power supply voltage of each of the inverters 41 to 4L causes an increase in time for the input pulse signal PA to reach the inverter 4L. Meanwhile, an increase in the power supply voltage of each of the inverters 41 to 4L causes a reduction in time for the input signal PA to reach the inverter 4L. If a pulse position is converted into a digital form, the ADC can operate using the power supply voltage of each inverter as an analog input voltage.

In order to realize the ADC with a high resolution by using the pulse phase difference detecting circuit disclosed in Japanese Unexamined Patent Application Publication No. 03-125514, a number of delay units corresponding to the number of desired bits are required. Thus, as the bit rate becomes higher, a total delay time of the delay units increases, and a time period from when the input pulse signal PA is input until when the pulse position is detected (i.e., a so-called sampling time of the ADC) becomes longer. This makes it difficult to perform a high-speed operation.

FIGS. 1 to 4 of Japanese Unexamined Patent Application Publication No. 2004-357030 disclose a pulse phase difference detecting circuit including m number of inverters which have different inversion levels and which are connected between delay units each including a pair of inverters. This configuration achieves a high resolution corresponding to the number of $\log_2 m$ bits, without reducing the operation speed.

As disclosed in Japanese Unexamined Patent Application Publication Nos. 03-125514 and 2004-357030, each of the delay units includes a pair of inverters for the following reason. That is, if each of the delay units is composed of one inverter, the detection time varies depending on an output logic of an inverter pulse, due to the fact that a rise time (tr) at which the output of each inverter is switched from the low level to the high level is different from a fall time (tf) at which the output of each inverter is switched from the high level to the low level.

In view of the foregoing, the present inventor has studied on the pulse phase difference detecting circuit as follows. First, while it is necessary to detect an accurate pulse position in the ADC using the pulse phase difference detecting circuit, it is also necessary to secure a given data set time or data retention period so that a D-FF for detecting the pulse position can retrieve data. These factors are determined by a CMOS process.

Further, in order to achieve the ADC having a high operation speed, a high resolution, and a low voltage per 1 LSB, it is necessary to provide inverters having delay characteristics with a small delay time and a large delay variation with respect to a voltage per 1 LSB. For example, CMOS transistors configured to operate at a voltage close to a threshold voltage Vth may be used as the inverters having a large delay variation with respect to a voltage. When the inverters are used to operate at the voltage close to the threshold voltage Vth, however, the delay amount of the entire delay units increases and the sampling time of the ADC also increases, which makes it difficult to perform a high-speed operation. In addition, since the transistor operation at the voltage close to the threshold voltage Vth is unstable, the delay variation (jitter) of the inverter increases, which results in a reduction in conversion accuracy of the ADC. For this reason, inverters are generally configured to operate at a sufficiently high voltage so as to stabilize the transistor operation.

Meanwhile, when the inverters are configured to operate at a voltage at which the transistor operation is stabilized, the delay variation per single delay unit with respect to the power supply voltage of each of the inverters is reduced. If the delay variation per single delay unit with respect to the voltage of each inverter is smaller than the data set time or data retention period necessary for a D-FF to retrieve data, it is impossible for the D-FF to detect the delay variation with the delay unit defined as 1 LSB, namely, the pulse position per 1 LSB. Accordingly, in order to obtain a sufficient delay variation per single delay unit for the pulse position detection using a D-FF, multi-stage delay units for securing a delay time need to be connected in series at the previous stage of the pulse phase difference detecting circuit. A detailed description thereof will be given below.

In the ADC using the pulse phase difference detecting circuit, a time for executing the pulse position detection is set to be equal to a time for a pulse to travel through all the delay units, when the smallest delay corresponding to the upper limit of the input voltage of the ADC is obtained. Specifically, the time for executing the pulse position detection is set so that a pulse reaches the most significant bit (MSB) located at the head of the pulse phase difference detecting circuit in the case where the input voltage of the ADC corresponds to the upper limit. Furthermore, the time for executing the pulse position detection is set so that a pulse reaches the least significant bit (LSB) located at the back end of the pulse phase detecting circuit in the case where the input voltage of the ADC corresponds to the lower limit.

Assuming herein that "$\Delta T$" represents a difference between the total delay amount of the delay units of the pulse phase difference detecting circuit at the input voltage corresponding to the upper limit and the total delay amount between the delay units of the pulse phase difference detecting circuit at the input voltage corresponding to the lower limit; "n" represents the number of bits of the ADC; "Td1" represents a delay amount per single delay unit at the time when the input voltage corresponds to the upper limit; and "Td2" represents a delay amount per single delay unit at the time when the input voltage corresponds to the lower limit, a relation $\Delta T = 2^n \times (Td2 - Td1)$ is satisfied. Thus, it is necessary to provide a delay time at the previous stage of the pulse phase difference detecting circuit by an amount corresponding to the difference $\Delta T$ between the total delay amounts.

For example, it is assumed that a 6-bit ADC having an accuracy of 1 LSB=10 mV at an input voltage in a range from 2.2 V to 1.6 V is designed by a CMOS process adopting a 0.35 μm rule. Further, it is herein assumed that the delay unit is formed of a pair of inverters. It is also assumed that each inverter includes a Pch transistor having a gate length L=1 μm and a gate width W=2 μm, and an Nch transistor having a gate length L=1 μm and a gate width W=1 μm. The delay amount of single delay unit composed of a pair of inverters has a voltage dependence as shown in FIG. 10. Specifically, the delay amount is about 1.2 ns when the input voltage is 2.2 V, and the delay amount is 2.3 ns when the input voltage is 1.6 V. In other words, the delay amount obtained when the input voltage is 1.6 V is about twice as large as the delay amount obtained when the input voltage is 2.2 V. In this case, the delay variation per single delay unit with respect to a change of 10 mV at the input voltage of 2.2 V is about 10 ps. Accordingly, when a D-FF is used, the delay variation corresponding to the change in input voltage value of about 2.2 V cannot be detected. Note that, under this condition, the difference $\Delta T$ between the total delay amount of the delay units of the pulse phase difference detecting circuit at the input voltage corresponding to the upper limit and the total delay amount of the delay units of the pulse phase difference detecting circuit at the input voltage corresponding to the lower limit is expressed as $\Delta T = (2.3 - 1.2)$ ns $\times 64 = 70$ ns.

Assuming that 64 delay units are connected to the previous stage of a pulse phase difference detection detecting unit composed of 64 delay units, when a pulse reaches the pulse phase difference detecting circuit, a delay variation corresponding to a change of 10 mV at the input voltage of 2.2 V is increased by an amount corresponding to about 10 ps×64=640 ps. Accordingly, a sufficient response time of a D-FF is secured. As a result, the pulse position corresponding to the change of 10 mV can be detected by the D-FF.

SUMMARY

The present inventor has found a problem that, when a plurality of delay units for securing a delay time are connected in series at the previous stage of a pulse phase difference detecting circuit, the sampling time of an ADC increases, and a high-speed operation becomes increasingly difficult as the bit rate becomes higher.

A first exemplary aspect of the present invention is a pulse phase difference detecting circuit including: a first delay circuit that receives a first pulse signal to output a signal obtained by delaying the first pulse signal as a second pulse signal, and includes a plurality of delay units which have the same delay amount and which are connected in series; a second delay circuit that receives the second pulse signal and includes a plurality of delay units which have the delay amount and which are connected in series; a first delay adjustment circuit that adjusts a delay amount with respect to the second pulse signal and inputs the second pulse signal again to the first delay circuit as a third pulse signal; and a pulse arrival position detecting circuit that detects a pulse arrival position of the first pulse signal based on an output of the delay units of the first delay circuit and based on an output of the delay units of the second delay circuit, the output of the delay units of the first delay circuit being transmitted as the third pulse signal and the output of the delay units of the second delay circuit being transmitted as the second pulse signal.

As second exemplary aspect of the present invention is an A/D converter including: a first delay circuit that receives a first pulse signal to output a signal obtained by delaying the first pulse signal as a second pulse signal, and includes a plurality of delay units having the same delay amount that varies in accordance with a voltage level of an analog input signal; a second delay circuit that receives the first pulse signal transmitted through the first delay circuit, as the second pulse signal, and includes a plurality of delay units which have a delay amount equal to that of the delay units of the first delay circuit and which are connected in series; a first delay adjustment circuit that adjusts a delay amount with respect to the second pulse signal and inputs the second pulse signal again to the first delay circuit as a third pulse signal; a first pulse arrival position detecting circuit that detects a pulse arrival position of the first pulse signal based on an output of the delay units of the first delay circuit and based on an output of the delay units of the second delay circuit, the output of the delay units of the first delay circuit being transmitted as the third pulse signal and the output of the delay units of the second delay circuit being transmitted as the second pulse signal; and a digital data generation circuit that generates digital data representing the analog input signal, based on the pulse arrival position of the first pulse signal.

According to an exemplary embodiment of the present invention, the first delay circuit can be used as a delay unit for securing a delay time, and also can be used as a delay unit for detecting a pulse phase difference. Thus, the sampling time of the ADC is reduced and a high-speed operation can be achieved even at a high bit rate.

According to an exemplary embodiment of the present invention, it is possible to provide a pulse phase difference detecting circuit having a high resolution and a high operation speed, and an A/D converter using the pulse phase difference detecting circuit.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
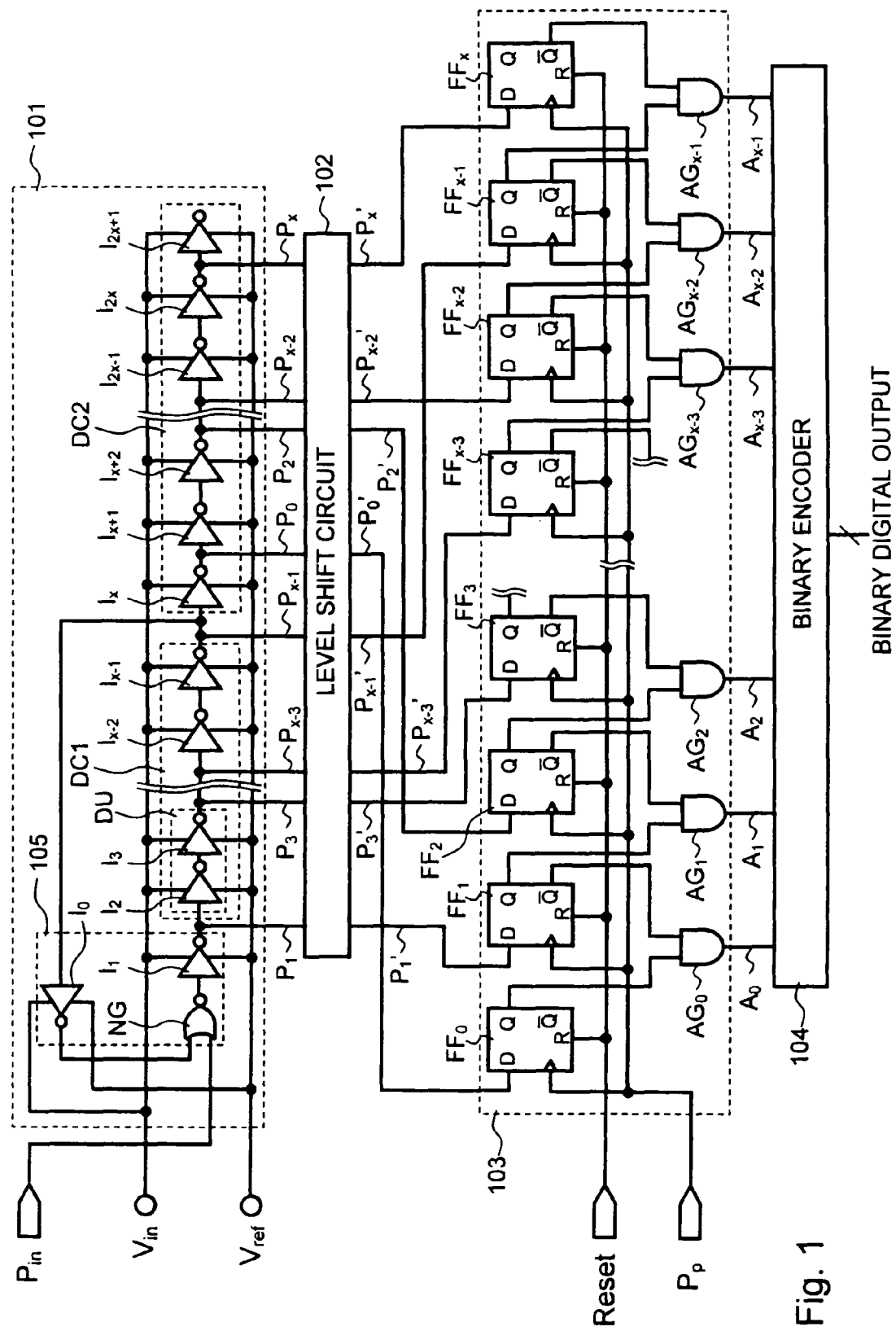
FIG. 1 is a circuit diagram showing an ADC using a pulse phase difference detecting circuit according to a first exemplary embodiment of the present invention.

Exemplary embodiments of the present invention will be described below with reference to the accompanying drawings. FIG. 1 is a circuit diagram showing an ADC using a pulse phase difference detecting circuit according to a first exemplary embodiment of the present invention. As shown in FIG. 1, the ADC according to the first exemplary embodiment includes a pulse phase difference detecting circuit 101, a level shift circuit 102, a pulse edge detecting circuit 103, and a binary encoder 104.

Referring to FIG. 1, the pulse phase difference detecting circuit 101 includes a NOR gate NG and (2x+2) number of inverters $I_0, I_1, I_2, I_3, \ldots, I_{x-2}, I_{x-1}, I_x, I_{x+1}, I_{x+2}, I_{2x-1}, I_{2x}$, and $I_{2x+1}$. Inverters $I_4$ to $I_{x-3}$ and inverters $I_{x+3}$ to $I_{2x-2}$ are omitted in FIG. 1. In this case, assuming that the ADC has a resolution of n bits, "x" is expressed as $x=2^n$. Each of the inverters operates at a voltage between a reference voltage $V_{ref}$ and an input voltage $V_{in}$. For example, when the reference voltage $V_{ref}$ is set as a ground voltage (0 V) and the input voltage $V_{in}$ is varied, a delay amount of each inverter varies. Note that a potential difference between the reference voltage $V_{ref}$ and the input voltage $V_{in}$ is an important factor here. Thus, both the voltages may be set as input voltages $V_{in1}$ and $V_{in2}$, for example, to be varied, instead of setting one of the voltages as the reference voltage $V_{ref}$.

Herein, the output terminal of the NOR gate NG is connected to the input terminal of the inverter $I_1$, and the output terminal of the inverter $I_1$ is connected to the input terminal of the inverter $I_2$. Further, the output terminal of the inverter $I_2$ is connected to the input terminal of the inverter $I_3$, and the inverters $I_{x-2}$ to $I_{2x+1}$ are sequentially connected in a similar manner. In this case, a pulse signal $P_{in}$ is input to the NOR gate NG.

The inverters $I_2$ to $I_{x-1}$ having the same dimensions and the same delay amount constitute a first delay circuit DC1. Meanwhile, the inverters $I_x$ to $I_{2x+1}$ having the same dimensions and the same delay amount constitute a second delay circuit DC2. The output of the first delay circuit DC1 or the output terminal of the inverter $I_{x-1}$ is connected to the input terminal of the second delay circuit DC2 or the input terminal of the inverter $I_x$. In this case, the inverter $I_{2x+1}$ disposed at the final stage of the second delay circuit DC2 is a dummy inverter which is not necessarily provided. In order to set the delay amount of the inverter $I_{2x}$ to be equal to the delay amount of each of the other inverters, however, it is preferable to add the dummy inverter.

Furthermore, the output terminal of the first delay circuit DC1 or the output terminal of the inverter $I_{x-1}$ is also connected to the input terminal of the inverter $I_0$. The output terminal of the inverter $I_0$ is connected to one input terminal of the NOR gate NG. As described above, the output terminal of the NOR gate NG is connected to the input terminal of the inverter $I_1$. The inverter $I_0$, the NOR gate NG, and the inverter $I_1$ constitute a delay adjustment circuit 105. The output of the delay adjustment circuit 105 or the output terminal of the inverter $I_1$ is connected to the input terminal of the first delay circuit DC1 or the input terminal of the inverter $I_2$. Accordingly, the delay amount of each signal output from the first delay circuit DC1 is adjusted by the delay adjustment circuit 105, and the signal thus adjusted is input back to the first delay circuit DC1.

The delay amount of the inverter $I_0$ constituting the delay adjustment circuit 105 is equal to the delay amount of each of the inverters $I_2$ to $I_{2x+1}$ constituting the first and second delay circuits DC1 and DC2. Meanwhile, the delay amount of the inverter $I_1$ constituting the delay adjustment circuit 105 is smaller than the delay amount of each of the other inverters, and the sum of the delay amounts of the inverter $I_1$ and the NOR gate NG is equal to the delay amount of each of the other inverters.

The first delay circuit DC1 and the second delay circuit DC2 each include a plurality of delay units DUs. As shown in FIG. 1, each delay unit DU includes a pair of inverters such as the inverters $I_2$ and $I_3$. The first delay circuit DC1 includes (x/2−1) number of delay units respectively including pairs of inverters $I_2$ and $I_3$, $I_4$ and $I_5$, $I_6$ and $I_7$, ..., $I_{x-4}$ and $I_{x-3}$, and $I_{x-2}$ and $I_{x-1}$. Meanwhile, the second delay circuit DC2 include x/2 number of delay units respectively including pairs of the inverters $I_{x+1}$ and $I_{x+2}$, $I_{x+3}$ and $I_{x+4}$, ..., $I_{2x-3}$ and $I_{2x-2}$, and $I_{2x-1}$ and $I_{2x}$.

As shown in FIG. 1, in the inverters $I_1$ to $I_{x-1}$, the odd-numbered inverters, namely, the inverters $I_1, I_3, \ldots, I_{x-3}$, and $I_{x-1}$ output signals $P_1, P_3, \ldots, P_{x-3}$, and $P_{x-1}$, respectively. In the inverters $I_x$ to $I_{2x}$, even-numbered inverters, namely, the inverters $I_x, I_{x+2}, \ldots, I_{2x-2}$, and $I_{2x}$ output signals $P_0, P_2, \ldots, P_{x-2}$, and $P_x$, respectively. The signals $P_0, P_1, P_2, \ldots, P_{x-2}, P_{x-1}$, and $P_x$ output from the pulse phase difference detecting circuit 101 are input to the level shift circuit 102.

The level shift circuit 102 is a circuit that shifts the level of each of the signals output from the pulse phase difference detecting circuit 101 to an appropriate level so that the signals are input to D flip-flops constituting the pulse edge detecting circuit 103. The pulse signals $P_0, P_1, P_2, \ldots, P_{x-2}, P_{x-1}$, and $P_x$ input to the level shift circuit 102 are output as pulse signals $P_0', P_1', P_2', \ldots, P_{x-2}', P_{x-1}'$, and $P_x'$, respectively, from the level shift circuit 102.

The pulse edge detecting circuit 103 includes (x+1) number of D flop-flops $FF_0$ to $FF_x$ and x number of AND gates $AG_0$ to $AG_{x-1}$. A data input terminal D of the D flip-flop $FF_0$ receives the pulse signal $P_0'$ output from the level shift circuit 102. Further, a data input terminal D of the D flip-flop $FF_1$ receives the pulse signal $P_1'$ output from the level shift circuit 102. Likewise, data input terminals D of the D flip-flops $FF_2$ to $FF_x$ respectively receive the pulse signals $P_2'$ to $P_x'$ output from the level shift circuit 102. A reset input terminal R of each of the D flip-flops receives a reset signal Reset as needed. A clock input terminal of each of the D flip-flops receives a position detecting pulse $P_p$.

The AND gate $AG_0$ receives a signal output from an output terminal Q of the D flip-flop $FF_0$ and a signal output from an inverted output terminal –Q of the D flip-flop $FF_1$. Further, the AND gate $AG_1$ receives a signal output from an output terminal Q of the D flip-flop $FF_1$ and a signal output from an inverted output terminal –Q of the D flip-flop $FF_2$. Likewise, the AND gates $AG_2$ to $AG_{x-1}$ respectively receive signals output from output terminals Q of the D flip-flops $FF_2$ to $FF_{x-1}$ and signals output from inverted output terminals –Q of the D flip-flops $FF_3$ to $FF_x$. Then, the AND gates $AG_0$ to $AG_{x-1}$ output signals $A_0$ to $A_{x-1}$, respectively. The signals are thus output through the AND gates, which enhances the accuracy of detecting a pulse position.

The binary encoder 104 carries out binary conversion on the signals $A_0$ to $A_{x-1}$ output from the pulse edge detecting circuit 103, and outputs the signals as binary digital data.

Figure 2:
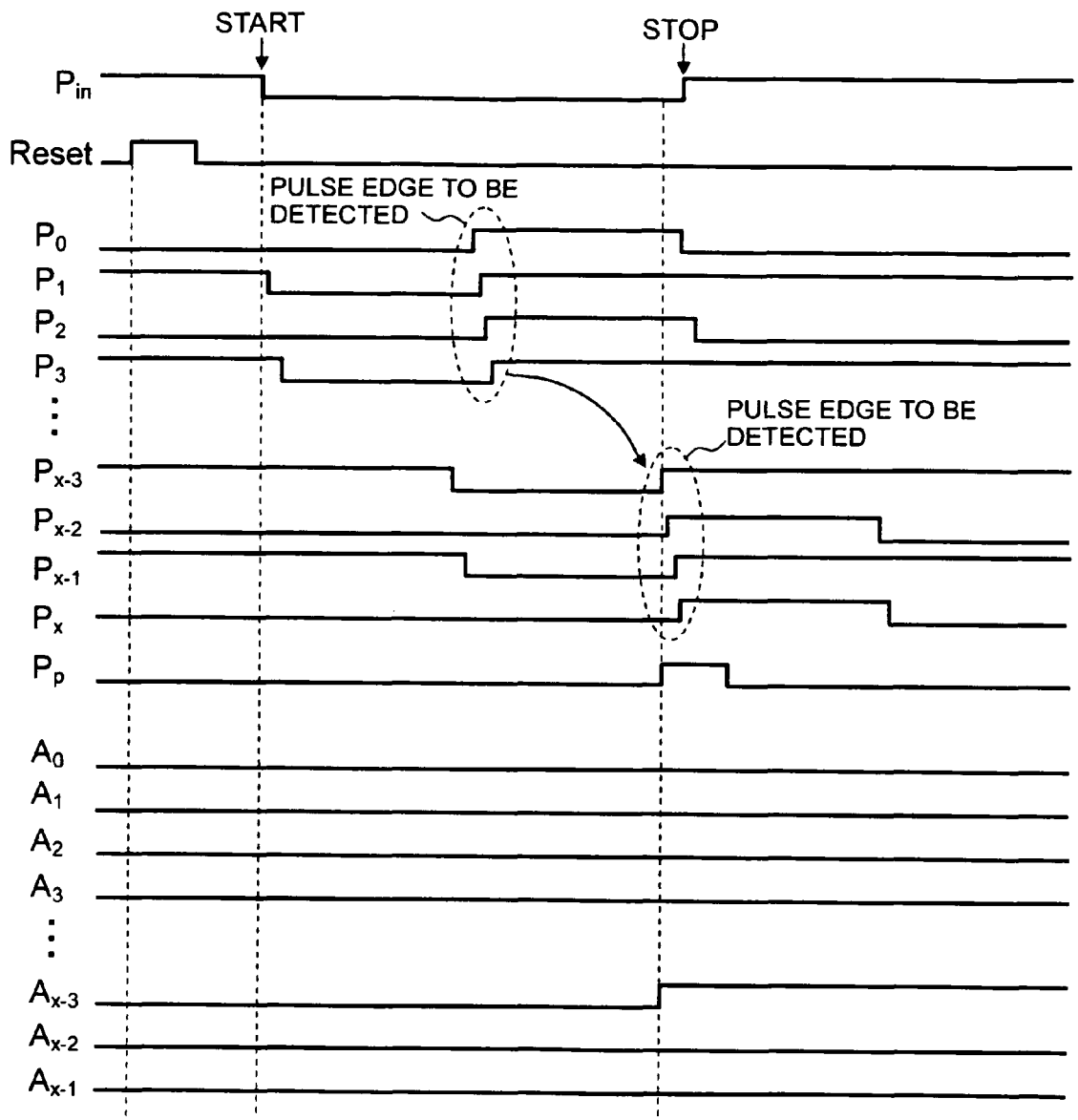
FIG. 2 is a timing diagram.
Figure 3:
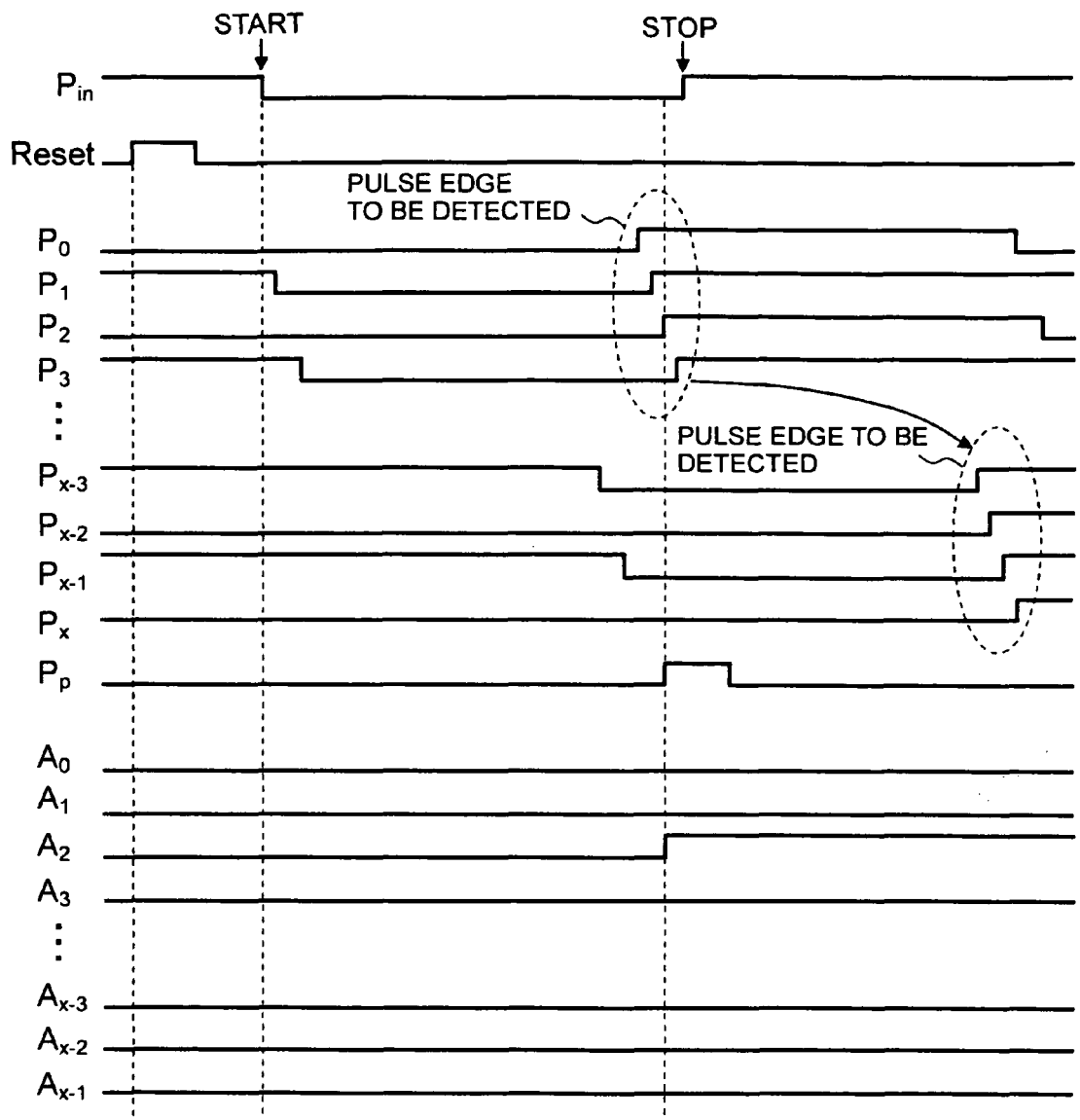
FIG. 3 is a timing diagram showing a case where the input voltage $V_{in}$ is lower than the input voltage $V_{in}$ in FIG. 2.

Referring next to FIGS. 2 and 3, a description is given of operations of the ADC using the pulse phase difference detecting circuit according to the first exemplary embodiment. FIG. 2 is a timing diagram showing a case where the input voltage $V_{in}$ is at a higher level and the amount of delay is smaller. Meanwhile, FIG. 3 is a timing diagram showing a case where the input voltage $V_{in}$ is at a lower level and the amount of delay is larger. As shown in FIGS. 2 and 3, prior to the start of measurement, the reset signal Reset is input to the reset input terminal R of each of the D flip-flops $FF_0$ to $FF_x$ constituting the pulse edge detecting circuit 103.

As shown in FIGS. 2 and 3, at the start of the measurement, the pulse signal $P_{in}$ of a negative logic is input to the pulse phase difference detecting circuit 101. In this case, when the pulse signal $P_{in}$ is at the high level, the signals $P_1, P_3, \ldots, P_{x-3}$, and $P_{x-1}$ output from the inverter $I_1$ and the odd-numbered inverters constituting the delay circuit DC1, namely, the inverters $I_3, \ldots, I_{x-3}$, and $I_{x-1}$ are at the high level. Meanwhile, the signals $P_0, P_2, \ldots, P_{x-2}$, and $P_x$ output from the even-numbered inverters constituting the second delay circuit DC2, namely, the inverters $I_x, I_{x+2}, \ldots, I_{2x-2}$, and $I_{2x}$ are at the low level.

When the pulse signal $P_{in}$ is switched to the low level, the signal $P_1$ output from the inverter $I_1$ is switched to the low level. Then, after passing through the delay unit DU including the inverters $I_2$ and $I_3$, namely, after the elapse of a delay time corresponding to a pair of inverters, the signal $P_3$ output from the inverter $I_3$ is switched to the low level. After that, the output signals $P_5, P_7, \ldots, P_{x-3}$, and $p_{x-1}$ are sequentially switched to the low level every time the delay time corresponding to each pair of inverters elapses. The time between the input of the pulse signal $P_{in}$ and the first output of the pulse signal from the inverter $I_{x-1}$ is used to generate a predetermined delay amount. As described later, the inverters $I_1$ to $I_{x-1}$ are used not only to generate the delay amount but also to detect a pulse phase difference. This eliminates the need of providing the delay unit which is used to generate the delay amount in the related art. Thus, the number of delay units can be reduced by half.

The signal $P_{x-1}$ output from the first delay circuit DC1 or the inverter $I_{x-1}$ is input to the second delay circuit DC2. After the elapse of a delay time corresponding to one inverter, the signal $P_0$ output from the inverter $I_x$ is switched from the low level to the high level. Then, after passing through the delay unit DC including the inverters $I_{x+1}$ and $I_{x+2}$, namely, after the elapse of the delay time corresponding to a pair of inverters, the signal $P_2$ output from the inverter $I_{x+2}$ is switched from the low level to the high level. After that, the output signals $P_4, P_6, \ldots, P_{x-2}$, and $P_x$ are sequentially switched from the low level to the high level every time the delay time corresponding to a pair of inverters elapses.

The signal $P_{x-1}$ output from the first delay circuit DC1 or the inverter $I_{x-1}$ is also input to the input terminal of the NOR gate NG again through the inverter $I_0$ having the same delay amount as that of each of the other inverters. As described above, the sum of the delay amounts of the inverter $I_1$ and the NOR gate NG is equal to the delay amount of each of the other inverters. For this reason, the signal $P_{x-1}$ output from the inverter $I_{x-1}$ is switched to the low level, and after the elapse of the delay time corresponding to a pair of inverters, the signal $P_1$ output from the inverter $I_1$ is switched from the low level to the high level. After that, the output signals $P_3, P_5, \ldots, P_{x-3}$, and $P_{x-1}$ are sequentially switched to the high level every time the delay time corresponding to a pair of inverters elapses.

Thus, referring to FIGS. 2 and 3, the signals $P_0, P_1, P_2, P_3, \ldots, P_{x-2}, P_{x-1}$, and $P_x$ are sequentially switched from the low level to the high level every time the delay time corresponding to one inverter elapses. In a manner as described above, the ADC is designed to be capable of detecting the pulse using the same logic signal at the output terminals receiving odd-numbered pulse signals ($P_1, P_3, P_5, \ldots$) and at the output terminals receiving even-numbered pulse signals ($P_0, P_2, P_4, \ldots$). This enables detection of the pulse phase difference at intervals of the delay time corresponding to one inverter. In this case, a rise time (tr) and a fall time (tf) of the output of each inverter are different. Accordingly, each delay unit that carries out the pulse position detection needs to include a pair of inverters, and needs to detect the pulse using the same logic signal. For this reason, it is difficult in the related art to detect the pulse position at intervals shorter than the intervals of the delay time corresponding to a pair of inverters. According to an exemplary embodiment of the present invention, it is possible to detect the pulse position at intervals of the delay time corresponding to one inverter, namely, a half of the delay time of the related art.

After the elapse of a predetermined time (i.e., sampling time of the ADC) from the start of switching of the pulse signal $P_{in}$ from the high level to the low level, the position detecting signal $P_p$ is input to the clock input terminal of each of the D flip-flops $FF_0$ to $FF_x$ constituting the pulse edge detecting circuit 103. Referring to FIG. 2, a pulse edge is detected at the output signal Ax-3. Further, referring to FIG. 3, a pulse edge is detected at the output signal A2. A pulse transit time corresponding to the upper limit of the ADC input voltage, which is a condition for the smallest delay, may be set as the sampling time of the ADC.

Lastly, the pulse signal $P_{in}$ is set to the high level again to stop the operation.

According to an exemplary embodiment of the present invention, the pulse position can be detected at intervals of the delay time corresponding to single inverter. As a result, the number of inverters constituting the pulse phase difference detecting circuit according to an exemplary embodiment of the invention can be halved, compared with the related art, and the total delay amount of the pulse phase difference detecting circuit 101 is reduced by half. Furthermore, the time for detecting the pulse position (sampling time of the ADC) can be reduced by half, which results in a high-speed operation.

A reduction in the number of inverters leads to a reduction in circuit size and chip layout size. Moreover, this facilitates the overall layout of the delay units in a layout design, resulting in a shorter distance between the relative positions of the delay units DU. Therefore, the relative accuracy of the delay amount between the inverters constituting each delay unit is improved, and stable accuracy of detecting the pulse phase difference can be ensured.

Second Exemplary Embodiment

Figure 4:
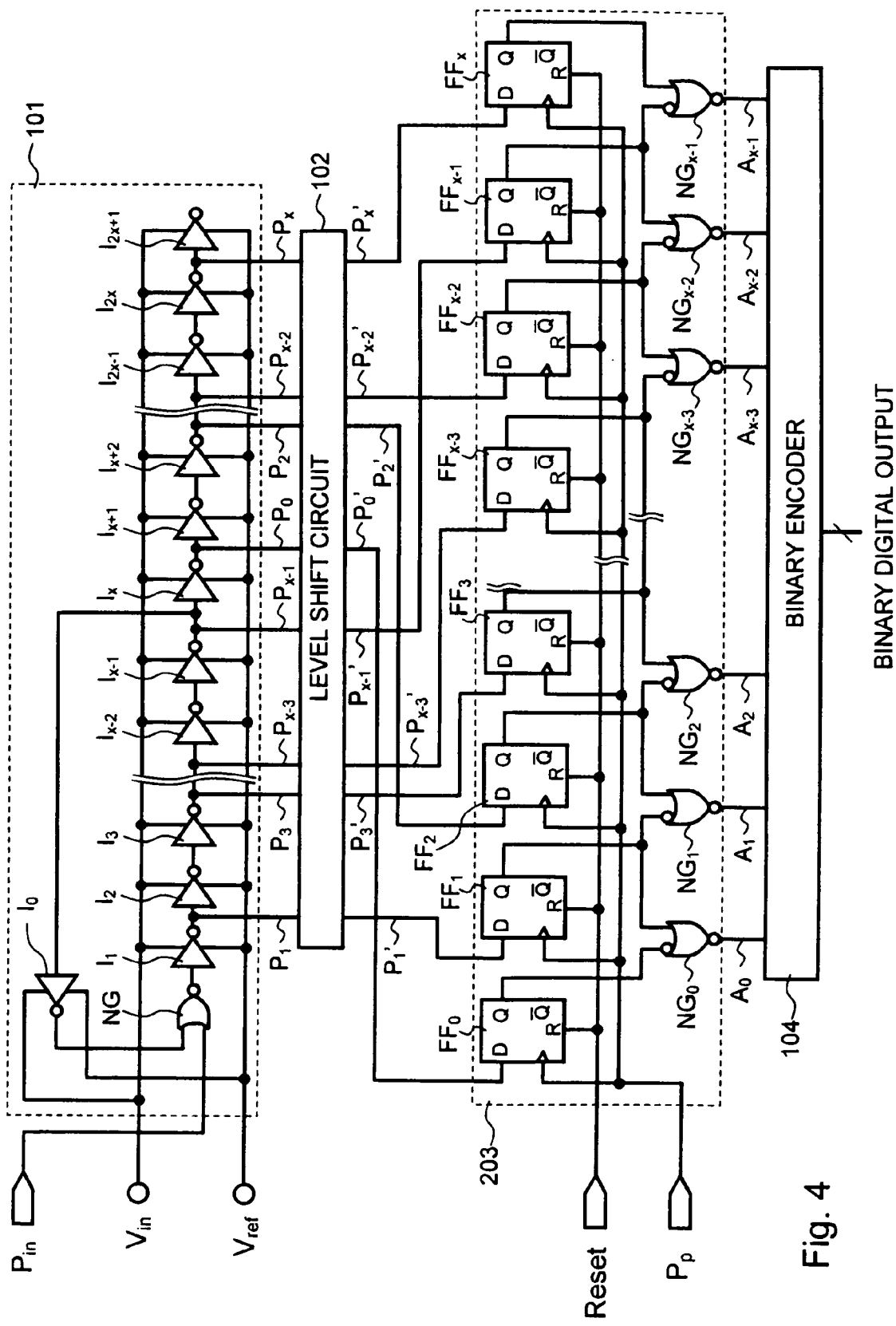
FIG. 4 is a circuit diagram showing an ADC using a pulse phase difference detecting circuit according to a second exemplary embodiment of the present invention.

Next, another exemplary embodiment of the present invention will be described. FIG. 4 is a circuit diagram showing an ADC according to a second exemplary embodiment of the present invention. Components identical with those of the first exemplary embodiment are denoted by the same reference symbols, and description thereof is omitted as appropriate. As shown in FIG. 4, the ADC according to the second exemplary embodiment includes a pulse edge detecting circuit 203 including NOR gates in replace of the AND gates shown in FIG. 1. The other components are similar to those of the first exemplary embodiment.

A NOR gate $NG_0$ receives a signal output from the output terminal Q of the D flip-flop $FF_0$, and a signal output from the output terminal Q of the D flip-flop $FF_1$. A NOR gate $NG_1$ receives a signal obtained by inverting a signal output from the output terminal Q of the D flip-flop $FF_1$ by an inverter, and a signal output from the output terminal Q of the D flip-flop $FF_2$. Likewise, NOR gates $NG_2$ to $NG_{x-1}$ respectively receive signals obtained by inverting signals output from the output terminals Q of the D flip-flops $FF_2$ to $FF_{x-1}$ by inverters, and signals output from the output terminals Q of the D flip-flops $FF_3$ to $FF_x$. Then, the NOR gates $NG_0$ to $NG_{x-1}$ output the signals $A_0$ to $A_{x-1}$, respectively.

In this case, when an output signal $P_m$ output from the pulse phase difference detecting circuit 101 and having an earlier pulse arrival time is at the high level and when an output signal $P_{m+1}$ adjacent to the signal $P_m$ is at the low level, a result indicating the presence of a pulse edge is output. Meanwhile, when the output signal $P_m$ and the adjacent output signal $P_{m+1}$ are logic signals different from those satisfying the above-mentioned conditions, a result indicating that the pulse edge has not reached or has passed is output from the NOR gates.

Note that the output of the D flip-flop having the earlier pulse arrival time is inverted by the inverter so that the stability and accuracy of the output results from the NOR gates are improved and a time difference is provided between the inputs.

Third Exemplary Embodiment

Figure 5:
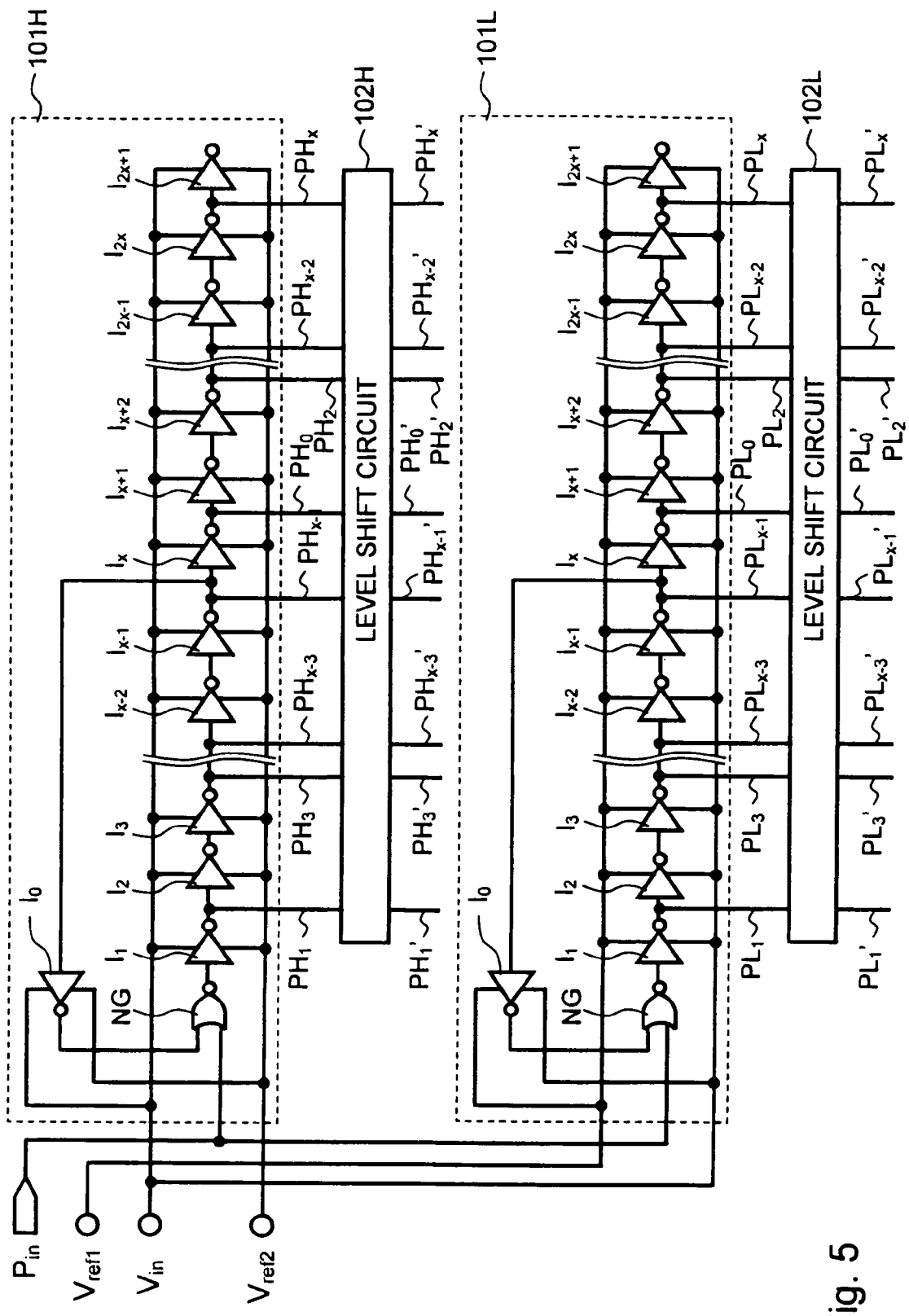
FIG. 5 is a circuit diagram showing a pulse phase difference detecting circuit according to a third exemplary embodiment of the present invention.
Figure 6:
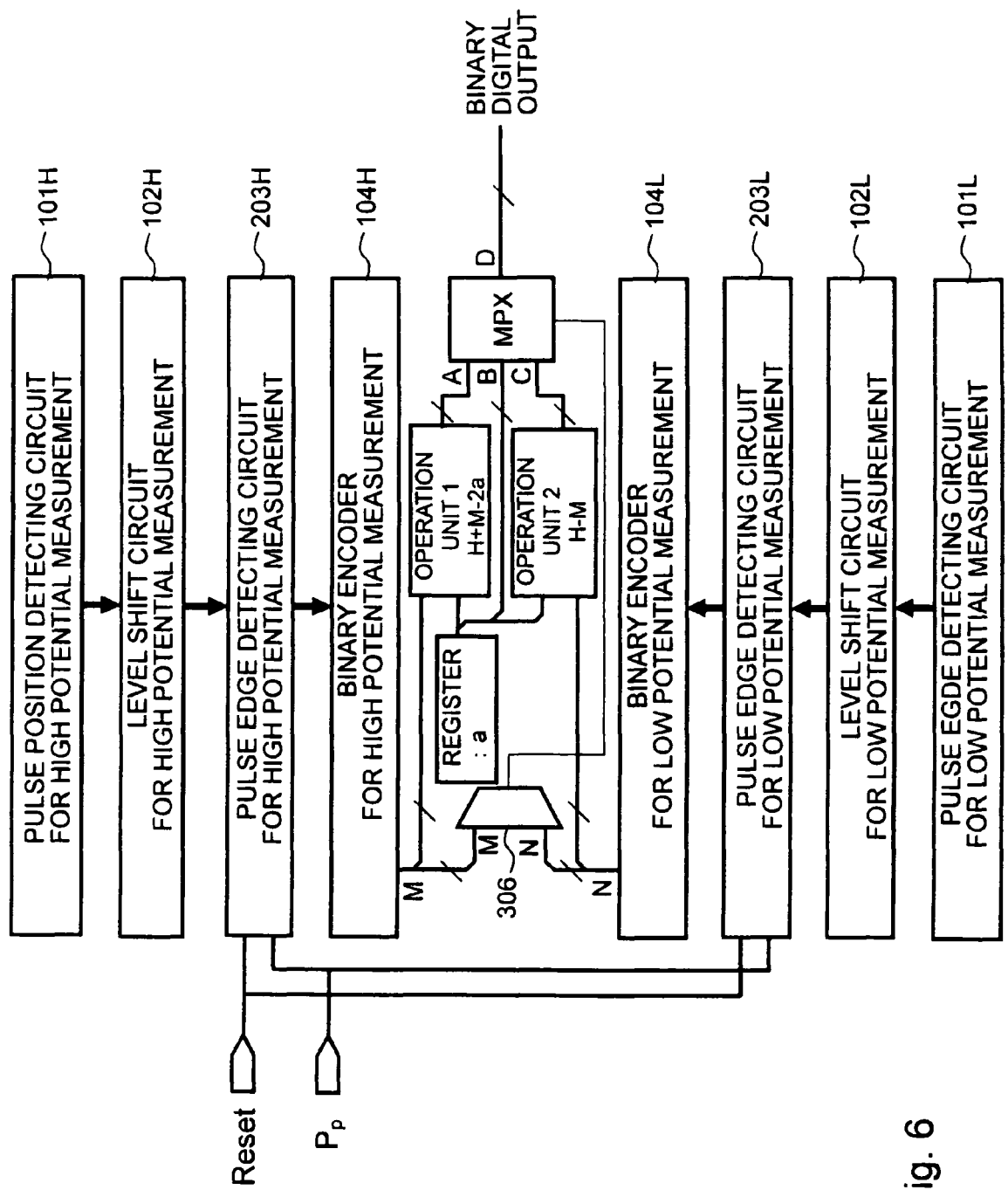
FIG. 6 is a block diagram showing the overall structure of an ADC according to the third exemplary embodiment.

Next, still another exemplary embodiment of the present invention will be described. FIG. 5 is a circuit diagram showing a pulse phase difference detecting circuit according to a third exemplary embodiment of the present invention. FIG. 6 is a block diagram showing an ADC using the pulse phase difference detecting circuit according to the third exemplary embodiment. Components identical with those of the first exemplary embodiment are denoted by the same reference symbols, and description thereof is omitted as appropriate.

When the inverters constituting the pulse phase difference detecting circuit 101 according to the first and second exemplary embodiments are used to operate at a voltage close to a threshold voltage Vth of a CMOS transistor, a delay variation due to a change in voltage increases. This increases the total delay amount of delay units and the sampling time of the ADC, which makes it difficult to perform a high-speed operation. In addition, transistor operation becomes unstable at the voltage close to the threshold voltage Vth, with the result that the delay variation (i.e., jitter) of each inverter increases and the conversion accuracy of the ADC is reduced. Therefore, in order to stabilize the operation of the CMOS transistor, it is necessary to set the input voltage $V_{in}$ of the ADC to be about a half of a voltage between a high-potential side voltage VDD and a low-potential side voltage VSS.

As shown in detail in FIG. 5, the ADC according to the third exemplary embodiment includes a pulse phase difference detecting circuit 101H for use when the input voltage $V_{in}$ is at higher level (for high potential measurement), and a pulse phase difference detecting circuit 101L for use when the input voltage $V_{in}$ is at lower level (for low potential measurement). For example, a reference voltage Vref2 of the pulse phase difference detecting circuit 101H for high potential measurement may be set as the low-potential side voltage VSS. Normally, the low-potential side voltage VSS corresponds to the ground voltage (0 V). Meanwhile, a reference voltage Vref1 of the pulse phase difference detecting circuit 101L for low potential measurement may be set as the high-potential side voltage VDD (e.g., 3V).

Referring to FIG. 5, in the inverters $I_1$ to $I_{x-1}$ of the pulse phase difference detecting circuit 101H for high potential measurement, signals $PH_1, PH_3, \ldots, PH_{x-3},$ and $PH_{x-1}$ are output from the odd-numbered inverters, namely, the inverters $I_1, I_3, \ldots, I_{x-3},$ and $I_{x-1}$. Further, in the inverters $I_x$ to $I_{2x+1}$, signals $PH_0, PH_2, \ldots, PH_{x-2},$ and $PH_x$ are output from the even-numbered inverters, namely, the inverters $I_x, I_{x+2}, \ldots, I_{2x-2},$ and $I_{2x}$. The signals $PH_0, PH_1, PH_2, \ldots, PH_{x-2}, PH_{x-1},$ and $PH_x$ output from the pulse phase difference detecting circuit 101H for high potential measurement are input to a level shift circuit 102H for high potential measurement. Then, pulse signals $PH_0', PH_1', PH_2', \ldots, PH_{x-2}', PH_{x-1}',$ and $PH_x'$ are output from the level shift circuit 102H for high potential measurement.

The pulse phase difference detecting circuit 101L for low potential measurement operates in a similar manner as the pulse phase difference detecting circuit 101H for high potential measurement. Signals $PL_0, PL_1, PL_2, \ldots, PL_{x-2}, PL_{x-1},$ and $PL_x$ output from the pulse phase difference detecting circuit 101L for low potential measurement are input to a level shift circuit 102L for low potential measurement. Then, pulse signals $PL_0', PL_1', PL_2', \ldots, PL_{x-2}', PL_{x-1}',$ and $PL_x'$ are output from the level shift circuit 102L for low potential measurement.

FIG. 6 is a block diagram of the ADC using the pulse phase difference detection circuit according to the third exemplary embodiment. Referring to FIG. 6, the signals output from the level shift circuit 102H for high potential measurement are output as binary digital data "M" from a binary encoder 104H for high potential measurement, through a pulse edge detecting circuit 203H for high potential measurement which is similar to the pulse edge detecting circuit 203 of the second exemplary embodiment. Likewise, the signals output from the level shift circuit 102L for low potential measurement are output as binary digital data "N" from a binary encoder 104L for low potential measurement, through a pulse edge detecting circuit 203L for low potential measurement.

The digital data "M" and "L" are input to a comparator 306 to be compared with each other. The comparison result is input to a multiplexer MPX as a control signal.

Further, the digital data "M" is input to an operation unit 1. The operation unit 1 calculates H+M−2a based on data "a" stored in a register and outputs the calculation result as data "A". In this case, the data "a" is a value obtained assuming M=N, and "H" represents the upper limit of the input voltage of each of the ADC for high potential measurement and the ADC for low potential measurement.

Furthermore, the digital data N is input to an operation unit 2. The operation unit 2 calculates H−N and outputs the calculation result as data "C".

The multiplexer MPX receives the data "A" output from the operation unit 1, the data "C" output from the operation unit 2, and data "B" serving as the data "a" stored in the register. Then, a result "D" is output as binary digital data in response to the control signal output from the comparator 306. In this case, D A is satisfied when M>N; D=B is satisfied when M=N; and D=C is satisfied when M<N.

Figure 7:
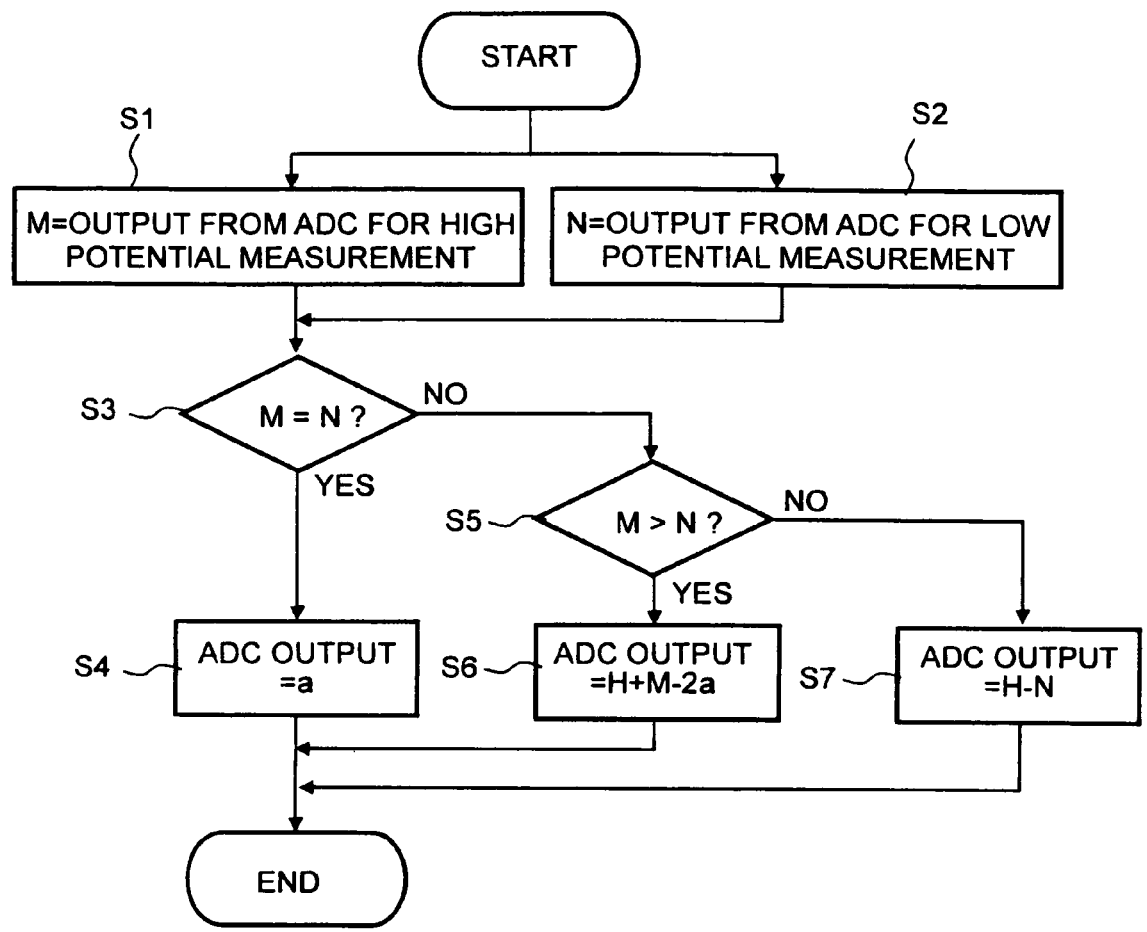
FIG. 7 is a flowchart showing data output processing in the ADC according to the third exemplary embodiment.

FIG. 7 is a flowchart showing the processing for the data "M" output from the ADC for high potential measurement and the data "N" output from the ADC for low potential measurement. The data "M" is output from the ADC for high potential measurement (S1). Meanwhile, the data "N" is output from the ADC for low potential measurement (S2). Then, it is determined whether the data "M" is equal to the data "N" (S3). When YES in Step S3, the data "a" is output as a result (S4). When NO in Step S3, it is determined whether the data "M" is greater than the data "N" (S5). When YES in Step S5, H+M−2a is output as a result (S6). When NO in Step S5, H−N is output as a result (S7).

Figure 8:
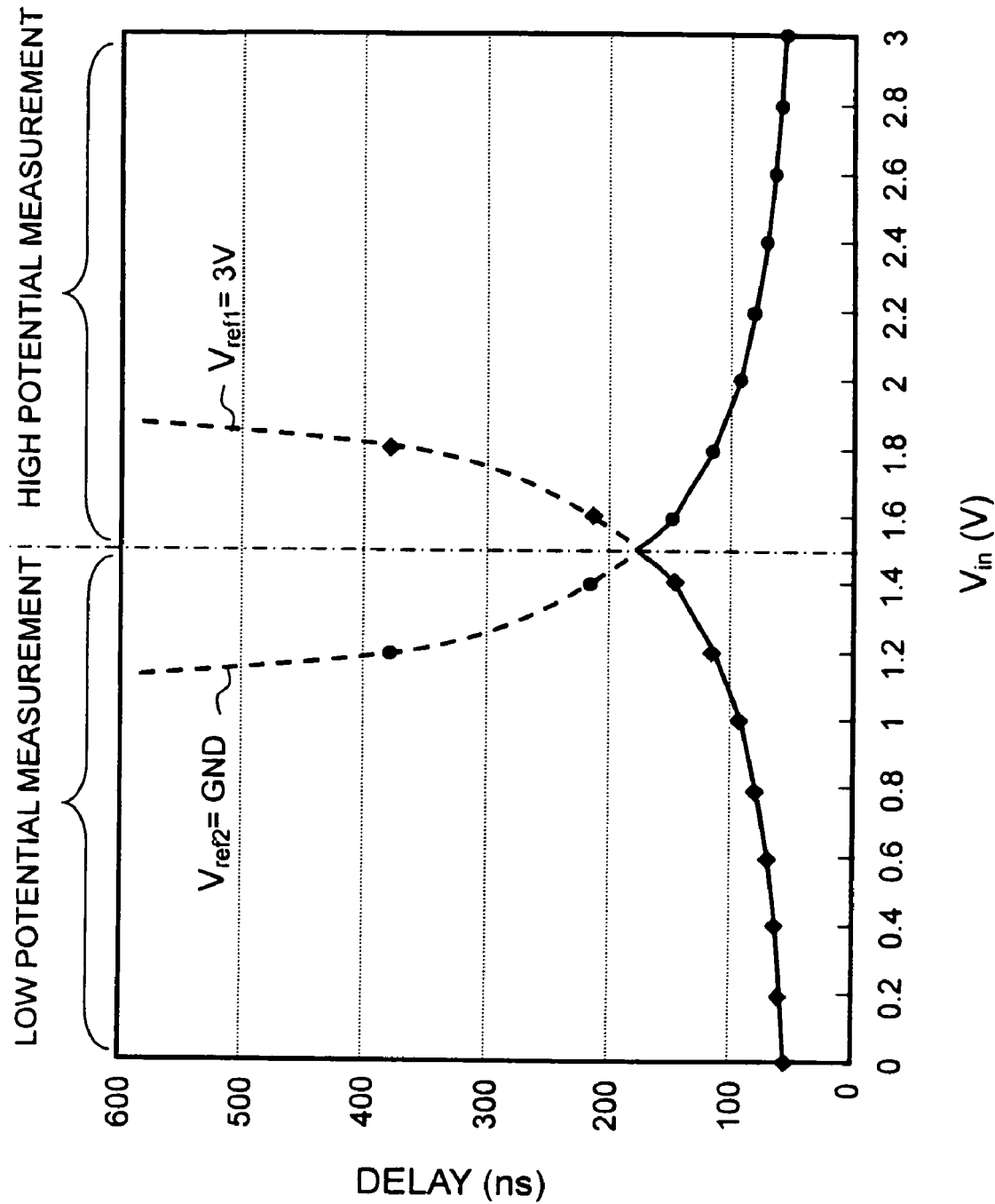
FIG. 8 is a graph showing the voltage dependence of a delay amount in the ADC according to the third exemplary embodiment.
Figure 9:
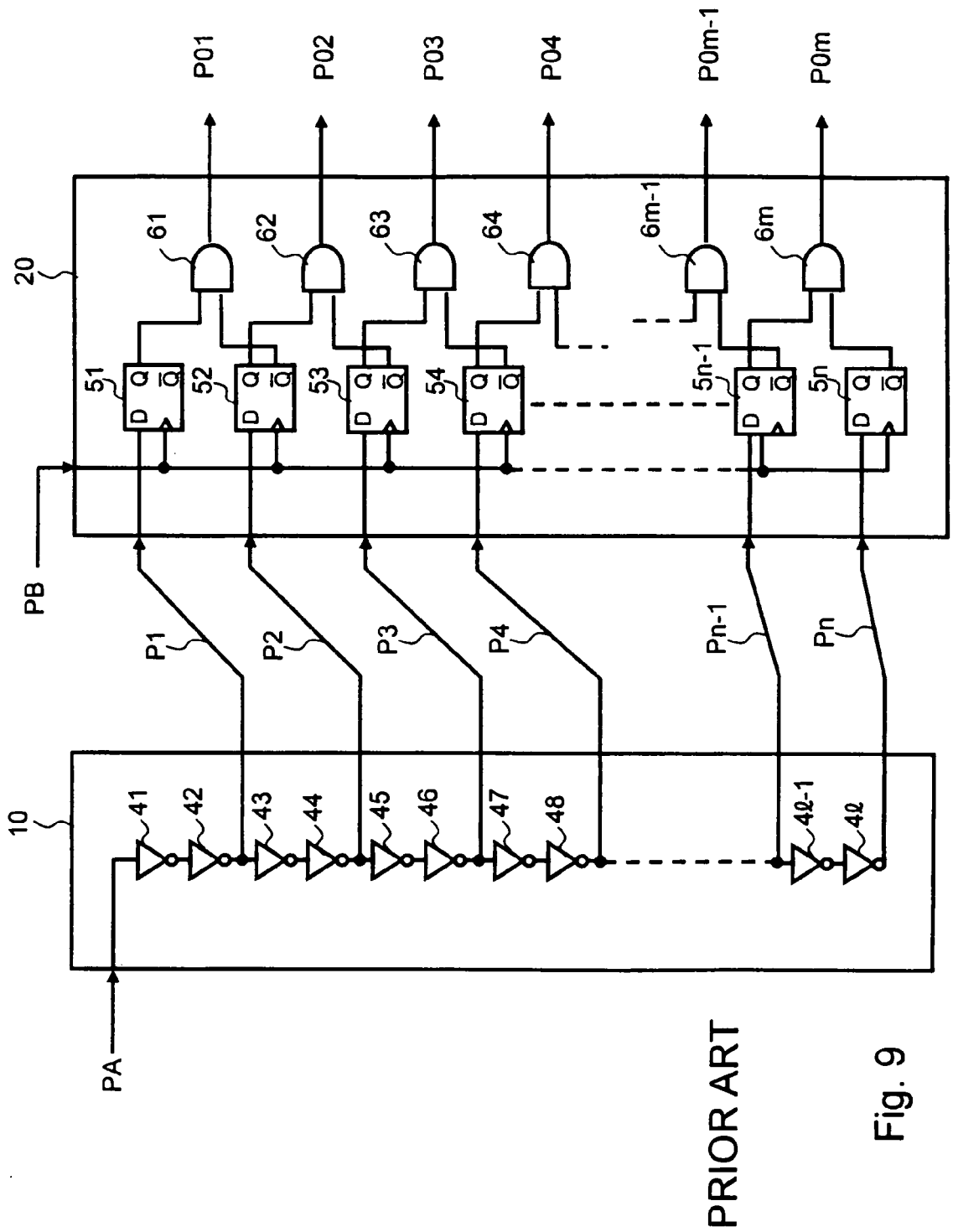
FIG. 9 corresponds to FIG. 1 of Japanese Unexamined Patent Application Publication No. 03-125514.
Figure 10:
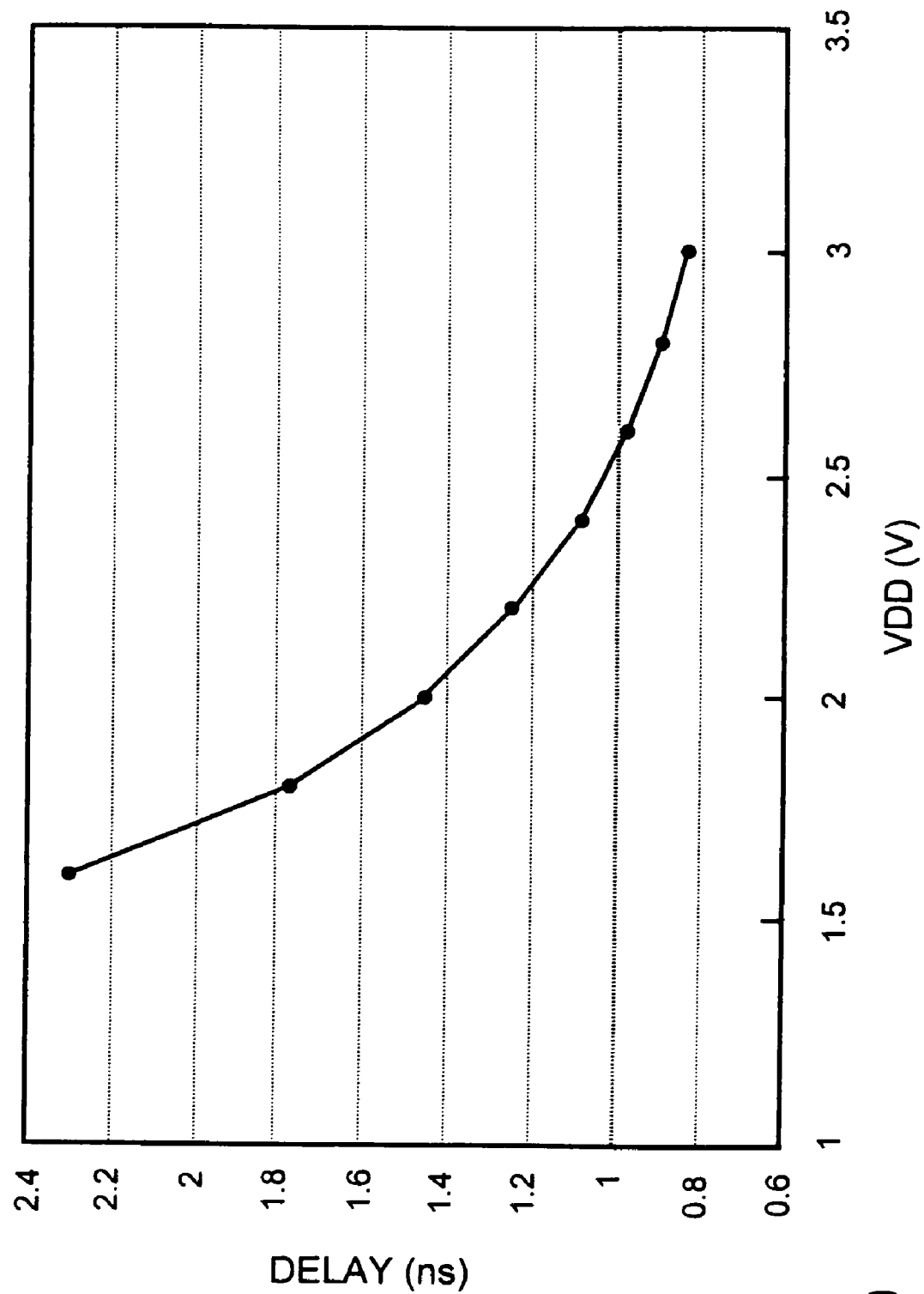
FIG. 10 is a graph showing the voltage dependence of a delay amount in a single delay unit.

FIG. 8 shows a change in delay amount relative to the input voltage $V_{in}$ when 64 delay units are provided. In the above-mentioned configuration, the input voltage $V_{in}$ at which the pulse detection result from the pulse phase difference detecting circuit 101H for high potential measurement is equal to the pulse detection result from the pulse phase difference detecting circuit 101L for low potential measurement is used as the reference. The reference corresponds to the data "a". When a voltage higher than the reference is applied, the pulse phase difference is detected by the pulse phase difference detecting circuit 101H for high potential measurement. Meanwhile, when a voltage lower than the reference is applied, the pulse phase difference is detected by the pulse phase difference detecting circuit 101L for low potential measurement. In the third exemplary embodiment, it may be determined which of the pulse phase difference detecting circuits has detected the pulse position near the MSB, and the pulse position may be detected.

According to the third exemplary embodiment, the high-potential side voltage VDD and the low-potential side voltage VSS of the pulse phase difference detecting circuit can be directly input to the input voltage $V_{in}$. Moreover, voltage can be measured over a wide range between the VDD and VSS.

As described above, according to an exemplary embodiment of the present invention, the pulse position can be detected at intervals of the delay time corresponding to a single stage inverter. As a result, the number of inverters constituting a pulse phase difference detecting circuit can be halved, compared with the related art, and the total delay amount of the pulse phase difference detecting circuit is reduced by half. Moreover, the time for detecting the pulse position (sampling time of the ADC) can be reduced by half, which results in a high-speed operation.

Furthermore, a reduction in the number of inverters leads to a reduction in circuit size and chip layout size. Moreover, this facilitates the overall layout of the delay units in a layout design, resulting in a shorter distance between the relative positions of the delay units. Therefore, the relative accuracy of the delay amount between the inverters constituting each delay unit is improved, and stable accuracy of detecting the pulse phase difference can be ensured.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A pulse phase difference detecting circuit comprising:
a first delay circuit that receives a first pulse signal to output a signal obtained by delaying the first pulse signal as a second pulse signal, and includes a plurality of delay units which have the same delay amount and which are connected in series;
a second delay circuit that receives the second pulse signal and includes a plurality of delay units which have the same delay amount and which are connected in series;
a first delay adjustment circuit that adjusts a delay amount with respect to the second pulse signal, and outputs the adjusted second pulse signal back to the first delay circuit as a third pulse signal; and
a pulse arrival position detecting circuit that detects a pulse arrival position of the first pulse signal based on an output of the delay units of the first delay circuit and based on an output of the delay units of the second delay circuit, the output of the delay units of the first delay circuit being transmitted as the third pulse signal and the output of the delay units of the second delay circuit being transmitted as the second pulse signal.

2. The pulse phase difference detecting circuit according to claim 1, wherein a delay difference between an output of a given delay unit of the first delay circuit and an output of a given delay unit of the second delay circuit is a half of the delay amount of each of the delay units, the output of the given delay unit of the first delay circuit being transmitted as the third pulse signal and the output of the given delay unit of the second delay circuit being transmitted as the second pulse signal.

3. The pulse phase difference detecting circuit according to claim 1, wherein the pulse arrival position detecting circuit comprises a plurality of latch circuits that latch an output of each of the delay units of the first and second delay circuits in response to a position detecting pulse.

4. An A/D converter comprising the pulse phase difference detecting circuit as set forth in claim 1, further comprising:
a digital data generation circuit that generates digital data representing an analog input signal, based on the pulse arrival position of the first pulse signal,
wherein the delay amount of each delay unit of the first and second delay circuits is the same and varies in accordance with a voltage level of the analog input signal; and
the second delay circuit receives the first pulse signal transmitted through the first delay circuit, as the second pulse signal.

5. The A/D converter according to claim 4, wherein a delay difference between an output of a given delay unit of the first delay circuit and an output of a given delay unit of the second delay circuit is a half of the delay amount of each of the delay units, the output of the given delay unit of the first delay circuit being transmitted as the third pulse signal and the output of the given delay unit of the second delay circuit being transmitted as the second pulse signal.

6. The A/D converter according to claim 4, wherein the pulse arrival position detecting circuit comprises a plurality of latch circuits that latch an output of each of the delay units of the first and second delay circuits in response to a position detecting pulse.

7. The A/D converter according to claim 4, further comprising:
a third delay circuit that outputs a signal obtained by delaying the first pulse signal as a fourth pulse signal, and includes a plurality of delay units which have a delay amount equal to that of the delay units of the first delay circuit and which are connected in series;
a fourth delay circuit that receives the fourth pulse signal and includes a plurality of delay units which have a delay amount equal to that of the delay units of the first delay circuit and which are connected in series;
a second delay adjustment circuit that adjusts a delay amount with respect to the fourth pulse signal and outputs the adjusted fourth pulse signal back to the third delay circuit as a fifth pulse signal; and
a second pulse arrival position detecting circuit that detects a pulse arrival position of the first pulse signal based on an output of the delay units of the third delay circuit and based on an output of the delay units of the fourth delay circuit, the output of the delay units of the third delay circuit being transmitted as the fifth pulse signal and the output of the delay units of the fourth delay circuit being transmitted as the fourth pulse signal,
wherein the delay amount of each of the delay units of the first and second delay circuits is determined based on a potential difference between the analog input signal and a first reference voltage signal, and the delay amount of each of the delay units of the third and fourth delay circuits is determined based on a potential difference between a second reference voltage signal and the analog input signal, the second reference voltage signal being different from the first reference voltage signal.

8. The A/D converter according to claim 6, wherein each of the plurality of latch circuits comprises a flip-flop.

9. The A/D converter according to claim 8, wherein the first pulse arrival position detecting circuit comprises a plurality of AND gates that receive two signals respectively output from two different flop flops.

10. The A/D converter according to claim 8, wherein the first pulse arrival position detecting circuit comprises a plurality of NOR gates that receive two signals respectively output from two different flip-flops.

11. The A/D converter according to claim 4, wherein each of the plurality of delay units comprises a pair of inverters connected in series.

12. The A/D converter according to claim 11, wherein the pair of inverters constituting each of the plurality of delay units have the same delay amount.

13. The A/D converter according to claim 4, further comprising a dummy inverter provided at a final stage of the second delay circuit.

* * * * *